United States Patent [19]
Gelston

[11] Patent Number: 5,940,787
[45] Date of Patent: *Aug. 17, 1999

[54] APPARATUSES AND METHODS OF MONITORING THE CONDITION OF TOOLS AND WORKPIECES

[75] Inventor: Alexander Ernst Gelston, Skaneateles, N.Y.

[73] Assignee: U.S. Tech Corporation, Syracuse, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/572,128

[22] Filed: Dec. 14, 1995

Related U.S. Application Data

[63] Continuation-in-part of application No. 08/307,247, Sep. 16, 1994, abandoned, which is a continuation-in-part of application No. 08/166,086, Dec. 10, 1993, abandoned.

[51] Int. Cl.$^6$ ............................. G01R 29/00; G06F 15/00
[52] U.S. Cl. ............... 702/134; 364/474.16; 364/474.17; 364/475.09; 340/680; 324/76.56
[58] Field of Search ..................................... 364/474, 507, 364/508, 554, 551.02, 474.16, 474.17, 475.09, 478.01; 340/680, 683; 356/386, 372; 250/561; 324/76.14, 26.56; 702/134

[56] References Cited

U.S. PATENT DOCUMENTS

| | | | |
|---|---|---|---|
| 4,613,812 | 9/1986 | Gelston, II | 324/642 |
| 4,724,524 | 2/1988 | Thomas et al. | 364/474 |
| 5,197,018 | 3/1993 | Oh | 364/508 |
| 5,212,391 | 5/1993 | Wachli | 250/561 |
| 5,293,048 | 3/1994 | Skunes et al. | 250/561 |

*Primary Examiner*—Kamini Shah
*Attorney, Agent, or Firm*—Graham & James LLP

[57] ABSTRACT

A method and apparatus for monitoring the condition of a tool or a workpiece includes an electromagnetic energy source for directing electromagnetic energy toward the tool and also receives electromagnetic energy reflected off the tool. A detector is arranged to receive the reflected electromagnetic energy from the electromagnetic energy source and converts the reflected energy into electronic signals. The electronic signals are transmitted from the detector to a control signal generator and then to a signal analyzing device. The signal analyzing device compares the electronic signals received from the control signal generator to reference signals to determine the condition of the tool or workpiece. Then, the control signal generator generates a control signal based on the result of the comparison performed by the signal analyzing device and transmits the control signal to a tool controlling device controlling the operation of the tool.

23 Claims, 16 Drawing Sheets

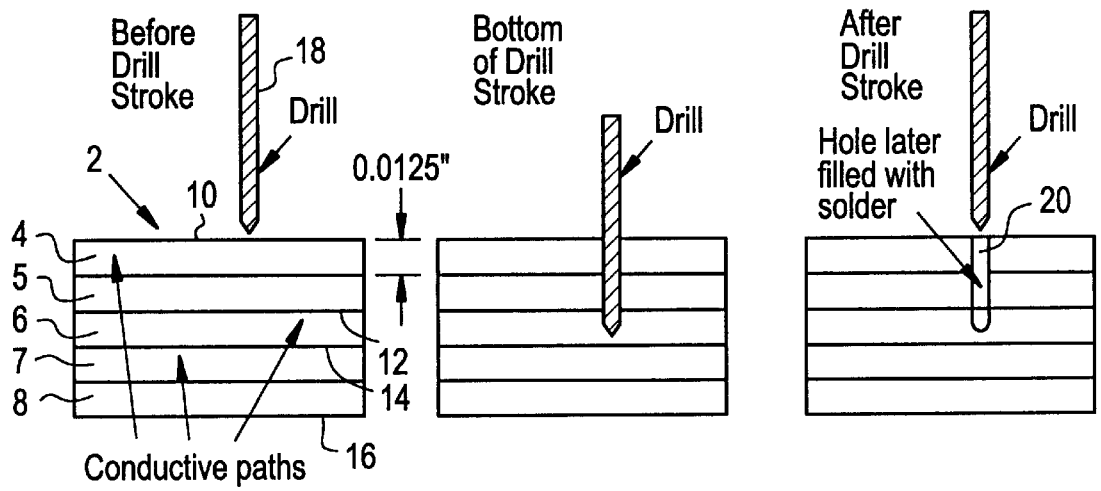
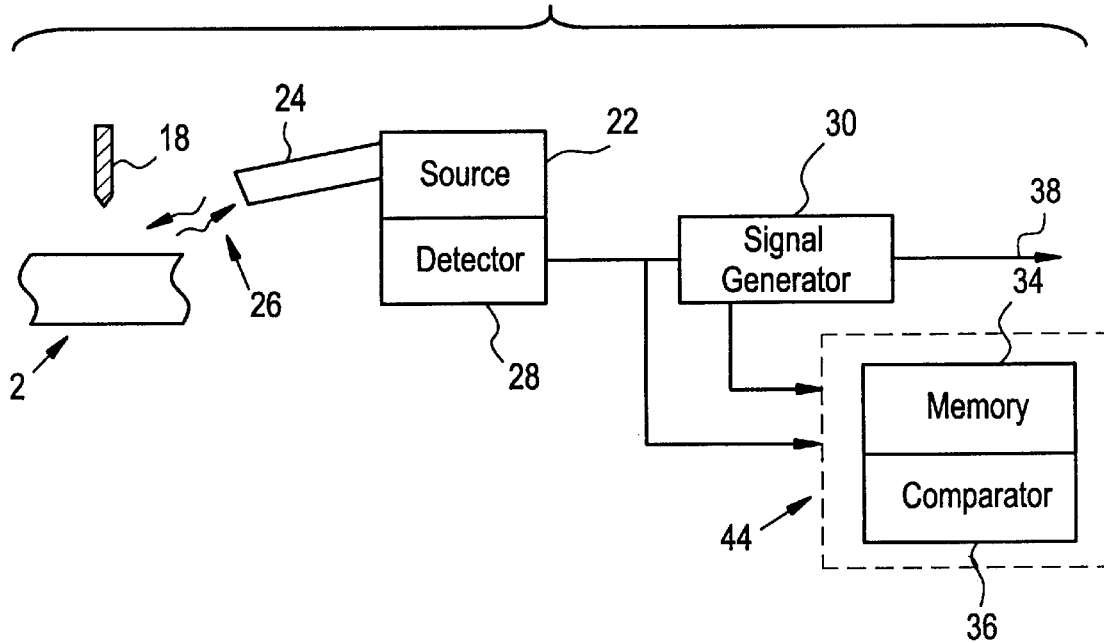

FIG. 4
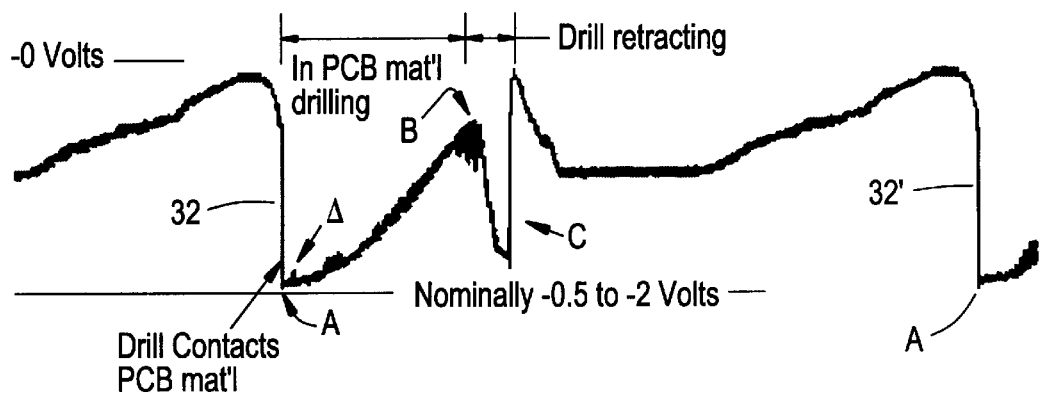
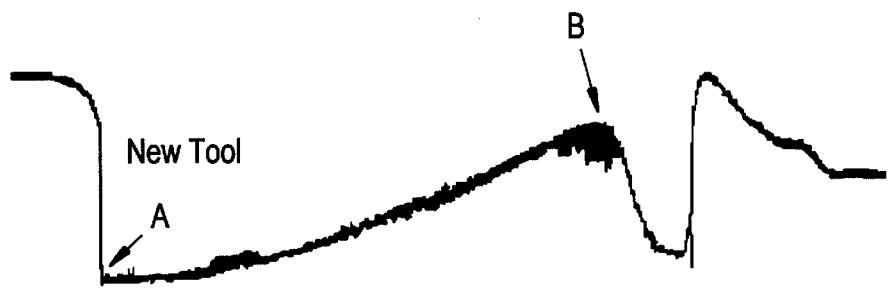
FIG. 8A
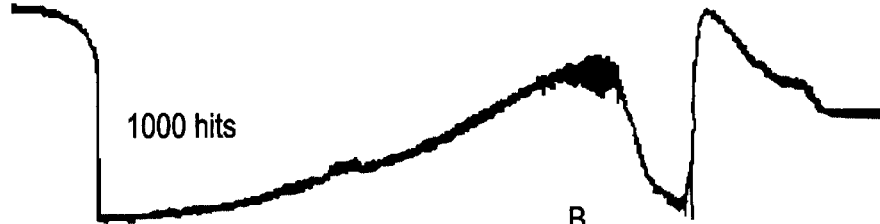
FIG. 8B
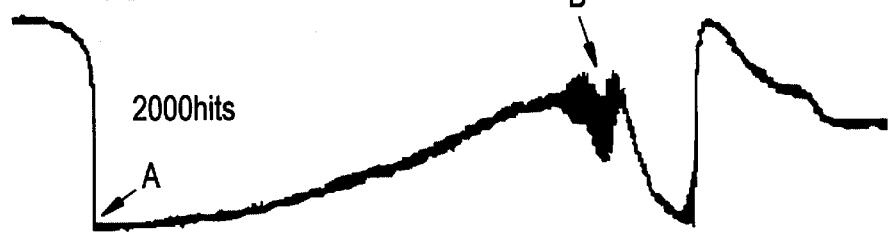
FIG. 8C

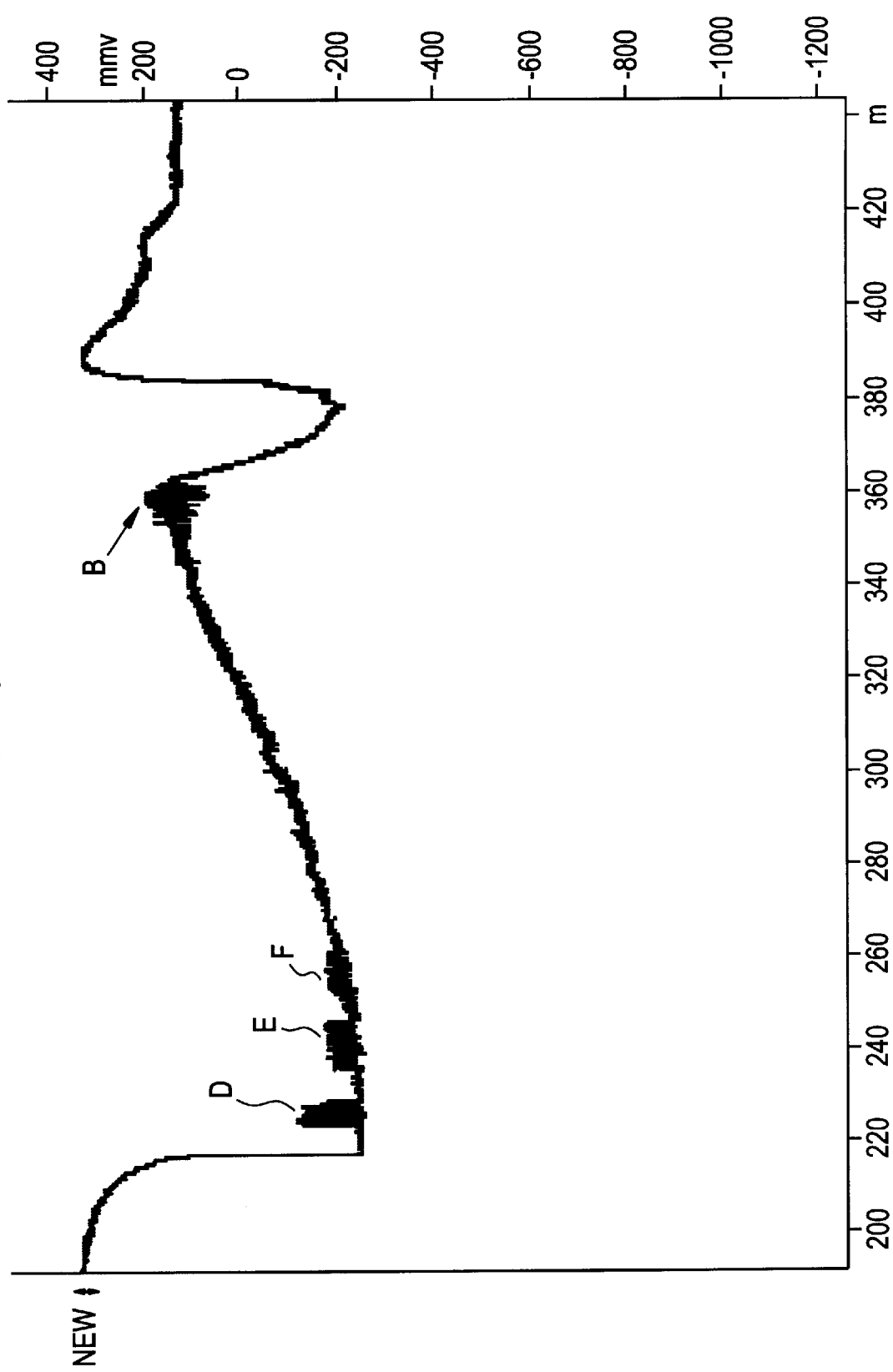

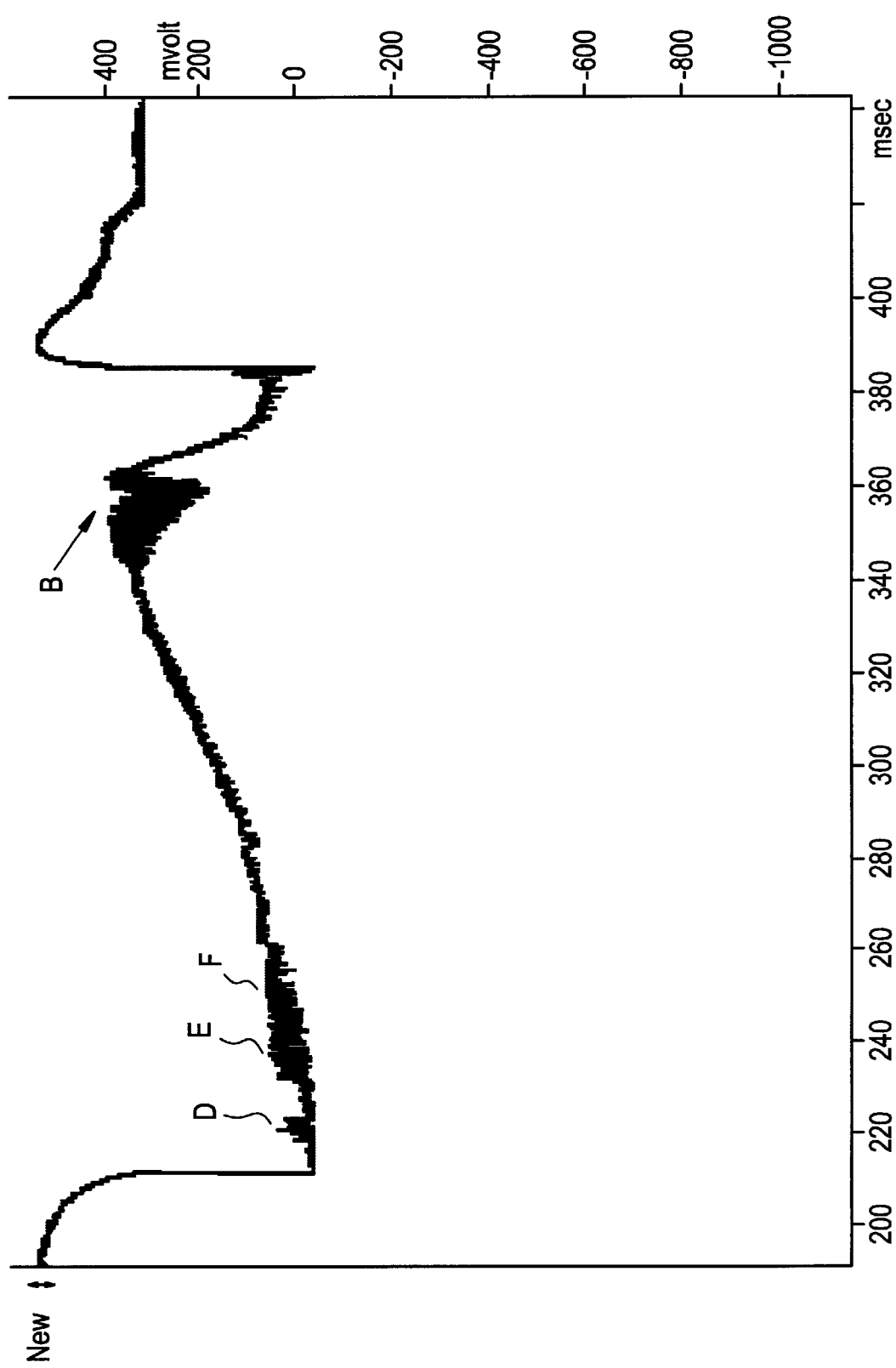

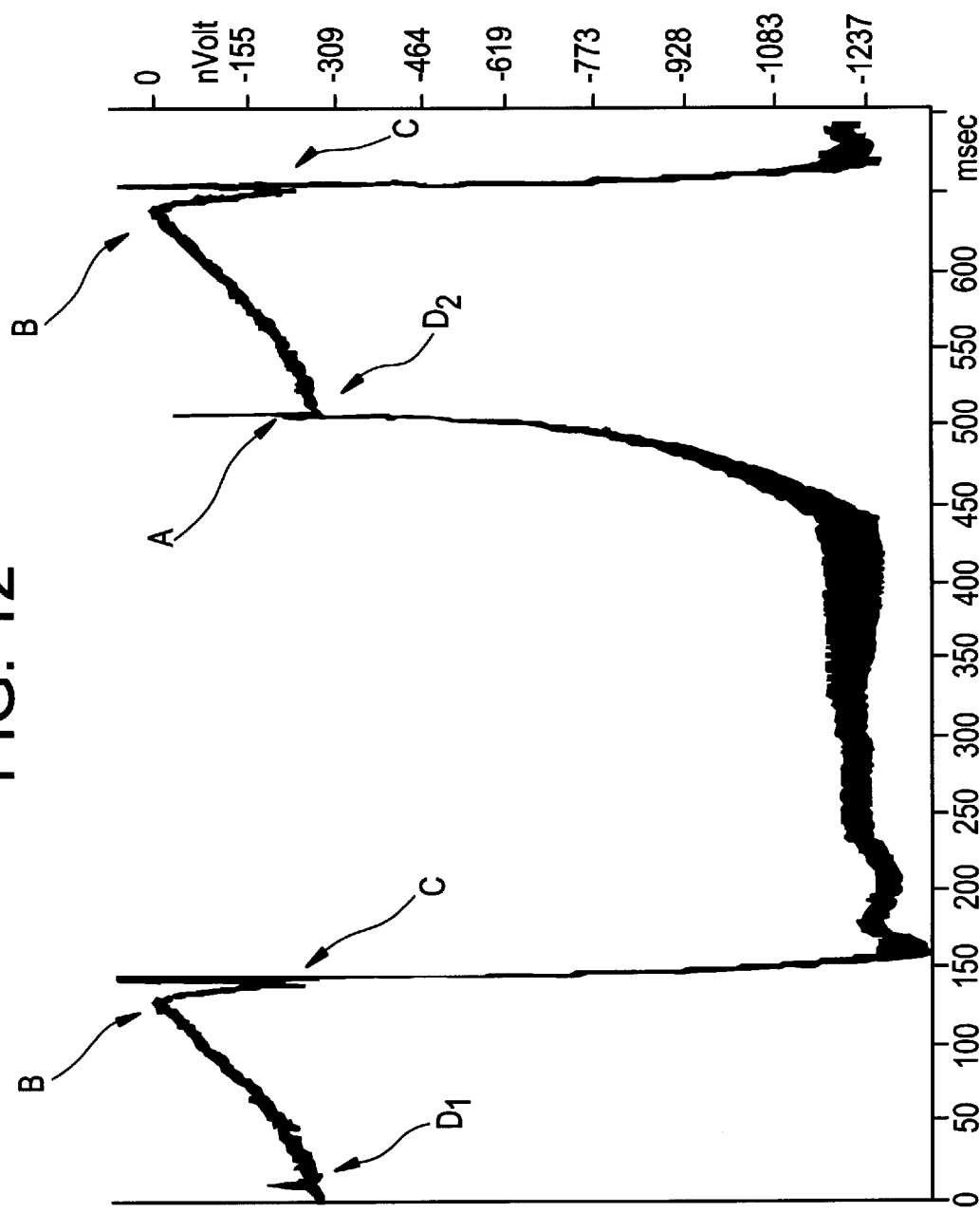

APPARATUSES AND METHODS OF MONITORING THE CONDITION OF TOOLS AND WORKPIECES

This is a Continuation-In-Part of my U.S. patent application Ser. No. 307,247, filed Sep. 16, 1994, now abandoned, which is a continuation-in-part of my application Ser. No. 08/166,086, filed Dec. 10, 1993, now abandoned.

BACKGROUND OF THE INVENTION

1. Field of Invention

The invention relates generally to determining the condition of tools and workpieces.

2. Discussion of Related Art

My U.S. Pat. Nos. 4,613,812 ('812) and 5,090,847 ('847) are hereby incorporated by reference. The '812 patent describes a microwave detection system for determining the continuity or discontinuity of a target, e.g., a drill bit during a machine-tool drilling operation. The '847 patent describe a pressure foot useful in a microwave detection system for improving detection of the presence of very fine drill bits, such as those used in fabricating microelectric circuits.

In the last decade, the machine tool and Printed Circuit Board (PCB) industry have its technical demands. The introduction of surface mount technology has promoted the use of smaller diameter drills. The holes are used not only to mount components but also to provide conductive paths from one level to another. The holes are often "elevator shafts" for connecting a circuit from one level to another in a multi-level printed circuit board. Therefore the size of the hole need only provide a path big enough for the required flow of electrons. The size limits on holes to be filled with "reflow solder" are a constraint that prevents the size of the holes from going to almost zero. In 1986, a hole diameter of 0.0139" (#80 drill) was considered very small, and less than 10% of the industry was regularly drilling holes that size. Today, 0.0139" is not just a frequently drilled diameter: if a supplier lacks that capability, then that lack will limit the supplier's customer base. The diameter that is now considered small is 0.0059", the diameter of a #97 drill, and some companies are trying to establish a capability for drilling a 0.003" diameter hole. To put this in perspective, an average human hair is 0.006" in diameter.

The advent of smaller circuit boards and microelectronics has made it necessary to use multilayer circuit boards to complete the conductive paths needed to make the circuits work. This in turn made it important to have some holes only drilled to a certain depth when these complex, multilayer boards are fabricated. Below that depth may be a conductive path that should not be connected to the path created through the hole. If the hole is drilled too deeply, solder in the hole will electrically connect all the layers through which the hole is drilled. Depth control can be most accurately maintained by indicating to the computer controlling the drill when the drill bit has actually touched the top of the PCB stack.

Currently there are techniques that use laser locator beams or mechanical "touch plates" to determine the location of the tip of a tool. This is done at a setup station at the edge of the drilling machine where the tool location relative to the pressure foot or a scale on the spindle z-axis is calibrated. The laser locator systems do work fairly well but are limited in their ability to detect the location of drill bits having very small diameters. The mechanical method has the significant disadvantage of occasionally damaging the tip of the tool. A small chip or other deformation of a cutting edge greatly affects the life of a tool and increases the potential for premature tool breakage.

Furthermore, the surface of a large PCB is not completely flat, and may warp or have surface variations or discontinuities. If the warp or variation is more than the depth of one of the several layers of the board, then the depth of some of the holes drilled may be either too shallow to make needed contacts to the layers, or too deep and thus make unwanted contact to a layer beneath the desired layer.

A further prior art shortcoming is the current wear-control policy of the PCB industry, which uses a given tool diameter for a preset number of holes referred to as "hits". In most cases this number of hits is low compared to what the tool can withstand before it is likely to break. Furthermore, the resharpening of a drill is a standard practice in the industry. The resharpened or repainted tools by nature have a different and less predictable life span. Therefore the need to determine when a tool is chipped or has some other condition that leads to a premature breakage would obviously be of great value to the industry. In addition, the ability to track the wear factor of a repainted tool would be extremely valuable since the serviceable life of a resharpened tool is not as exact as that of new tools.

The magnitude of the problem of tool breakage, excessive tool wear, and chipping or other damage, may be appreciated from the way complex printed circuit boards are drilled. A complex board may have thousands of holes drilled into it, and a computer controlled machine may take up to 4 hours to drill all the holes. If a drill breaks, some facilities discard an entire board that may have been affected by the drill's defect, to assure high quality. A worn drill or damaged drill will not produce acceptable quality holes and it is important to detect, or better yet predict, a defect in the drill. Thus, it is important to know when a tool will break.

In contrast with the Printed Circuit Board (PCB) industry, the machine tool (MT) industry has both different and similar conditions and needs. The MT industry currently has several options for detecting drill bit breakage. One of the options is to use a mechanical wand that rotates in to touch the tool after each drill stroke. Another option is a mechanical vibration monitor that "feels" if the machine vibrates differently during the drill stroke. A third option is a load monitor to track the current that the spindle motor uses to turn a tool attached to the spindle. If that current suddenly changes, then the system interprets that change as indicating a broken too. The manufacturer has maintained that this load monitor can also detect tool wear. This may be true, but only of the largest tool.

The MT industry still has a need to find a better way to detect the broken tools because each of the aforementioned methods has a weakness. The mechanical wand is subject to breakage and misalignment, and the contact of a mechanical wand with a tool can damage the tool. The vibration differences a machine experiences can have causes other than tool breakage; thus, the vibration monitors not a fully reliable method. A load monitor can interpret other current changes, such as line spikes and electrical noise, as tool information and this makes load monitors not very reliable.

The ability to reliably determine the wear status of a tool would greatly extend the useful life of a tool, yet make it possible to replace the tool before breakage occurs.

SUMMARY OF THE INVENTION

An object of the invention is to provide a method and apparatus for detecting that condition of a tool in contact with a workpiece.

Another objective is to determine workpiece condition, including but not limited to presence of discontinuities. Another object of the invention is to provide an apparatus for accomplishing these objectives.

More particularly, the present invention comprises an apparatus for monitoring the condition of a tool or a workpiece which comprises:

(a) means for generating electromagnetic energy toward the tool and receiving reflected energy off the tool;

(b) means for converting the reflected energy into electronic signals;

(c) means for recording the electronic signals generated by a sensor that is derived from the electromagnetic energy reflected off the tools;

(d) means for breaking the recorded signal down into components including frequency, amplitude and changes in frequencies;

(e) means for normalizing the components relative to themselves to produce values;

(f) means for comparing the normalized values to reference standards;

(g) means for evaluating the comparison to determine the condition of the tool or workpiece; and (h) means for signalling the condition of the tool or workpiece.

According to a further embodiment of the present invention the means for generating electromagnetic energy toward the tool and receiving the reflected energy off the tool comprises means for generating microwave energy toward the tool and receiving the reflected microwave energy off the tool.

According to a further embodiment of the present invention the apparatus additionally has means for differentiating chipped tools from unchipped tools.

According to a further embodiment of the present invention the apparatus additionally has means for differentiating less sharp tools from sharp tools.

According to a further embodiment of the present invention the apparatus additionally has means for differentiating debris-laden tools from debris-free tools.

According to a further embodiment of the present invention the apparatus additionally has means for differentiating a desired diameter from the diameter of the monitored tool.

According to a further embodiment of the present invention means for receiving the reflected energy off the tool comprises means for generating laser energy toward the tool and receiving the reflected laser energy off the tool.

The present invention also includes methods for determining the condition of a tool which operates on a workpiece and the condition of a workpiece during contact of a tool with the workpiece.

The method of monitoring the condition of a tool that operates on a workpiece comprises:

(a) reflecting electromagnetic energy off the tool;

(b) recording the signal generated by a sensor that is derived from electromagnetic energy reflected off the tool;

(c) breaking the recorded signal down into components including frequency, amplitude and changes in frequencies;

(d) normalizing the components relative to themselves to produce values;

(e) comparing the normalized values to reference standards; and (f) evaluating the comparison to determine the condition of the tool.

According to a further embodiment of the present invention the electromagnetic energy is microwave energy.

According to a further embodiment of the present invention the comparison of the normalized values to reference standards differentiates chipped tools from unchipped tools.

According to a further embodiment of the present invention the comparison of the normalized values to reference standards differentiates less sharp tools from sharp tools.

According to a further embodiment of the present invention the comparison of the normalized values to referenced standards differentiates debris-laden tools from debris-free tools.

According to a further embodiment of the present invention the comparison of the normalized values to referenced standards differentiates a desired diameter from the diameter of the monitored tool.

According to a further embodiment of the present invention the electromagnetic energy is laser energy.

The method of monitoring the condition of a workpiece during contact of a tool with the workpiece comprises:

(a) reflecting electromagnetic energy off the tool;

(b) recording the signal generated by a sensor that is derived from electromagnetic energy reflected off the tool;

(c) breaking the recorded signal down into components including frequency, amplitude and changes in frequencies;

(d) normalizing the components relative to themselves to produce values;

(e) comparing the normalized values to reference standards; and (f) evaluating the comparison to determine the presence or absence of discontinuities in the workpiece.

According to a further embodiment of the present invention the electromagnetic energy is microwave energy.

According to a further embodiment of the present invention the electromagnetic energy is laser energy.

According to a further embodiment of the present invention the workpiece is homogeneous.

According to a further embodiment of the present invention the workpiece is non-homogeneous.

BRIEF DESCRIPTION OF THE DRAWINGS

FIGS. 1(a), 1(b) and 1(c) are schematic cross sectional views illustrating an application of the invention to a multilayer printed circuit board;

FIG. 2 is a block diagram of one embodiment of the present invention;

FIG. 4 is a waveform output from the detector during the drilling of a printed circuit board;

FIGS. 8(a), 8(b) and 8(c) are waveforms similar to a segment of FIG. 4, illustrating changes in that waveform as a given tool and becomes worn;

FIGS. 9(a), 9(b), 9(c) and FIGS. 10(a), 10(b) and 10(c) are waveforms with a somewhat different scale, produced by other given tools;

FIG. 12 is a waveform similar to FIG. 4 for a tool made of a different alloy;

In the drawings like elements bear like reference numerals.

DETAILED DESCRIPTION OF THE INVENTION

Figure 3:
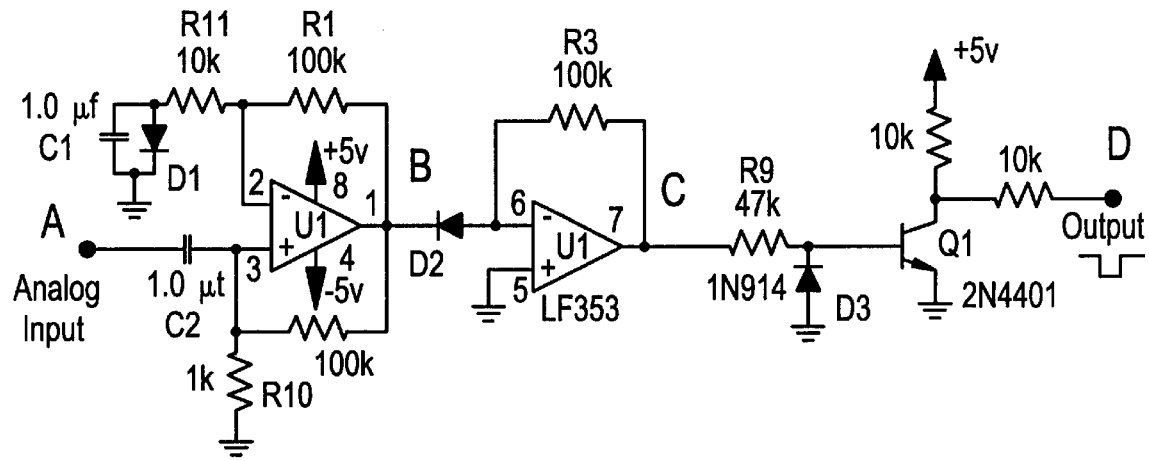
FIG. 3 is a circuit diagram of the signal generator that responds to the output of the detector of FIG. 2.

FIGS. 1(a), 1(b) and 1(c) are schematic diagrams of a multilayer printed circuit board 2 in cross section. The board has five layers of insulation material 4, 5, 6, 7 and 8, and six layers of electrical conductive patterns, or conductive paths, of which four are shown with reference numbers 10, 12, 14 and 16.

In a typical multilayered printed circuit board, conductive paths are printed on both faces of all layers. A hole is drilled by drill 18 to join conductive paths 10 and 12, i.e., to make a hole extending there between which will be then filled with a conductive metal such as solder. It is important that the hole be drilled to the proper depth because if it is drilled too deeply the hole will extend to conductive path 14 between layers 6 and 7.

If the hole is not drilled deep enough, and does not pass through path 12, then there will be no contact between paths 10 and 12. Each insulating layer 4–8 may for example be 0.0125" thick. The overall printed circuit board may be warped, or the drill 18 may be shorter or longer than expected. Thus it is important to know when the drill makes contact with the top surface of the printed circuit board 2, i.e., when it touches the uppermost path 10, in the example.

FIG. 1(a) shows the relative position of the parts before the drill stroke. FIG. 1(b) shows the tool at the bottom of the drill stroke. FIG. 1(c) shows the components after the drill stroke with a hole 20 which is later to be filled with solder.

An important point here is that the controller for the drill must know when the drill makes contact with the printed circuit board surface, so that the control computer for the drilling machine will then advance the drill the precise correct distance as shown in FIGS. 1(b) and 1(c).

FIG. 2 is a block diagram showing the tool 18, the workpiece 2 and one embodiment of the invention. A source of microwave electromagnetic radiation 22 in a sensor head having a waveguide 24 that directs the electromagnetic radiation, shown schematically at reference numeral 26, into the region proximate to the point of contact between the tool and the workpiece. A detector 28 receives the reflected radiation from this region and produces a signal waveform indicating a change in the reflected radiation pattern at the instant the tool makes contact with the printed circuit board material. The detector 28 then sends the signal to a control signal generator 30 and to a memory 34 in a microprocessor unit having a comparator 36 which can be used to identify waveform patterns characteristic of given events, or conditions in the drilling operation. The control signal generator 30 provides control signal to the computer (not shown) that controls the operation of the tool 18.

FIG. 3 is a diagram of a circuit 30a in the signal generator 30 that produces a control signal when the tool 18 contacts a workpiece 2. Preferably, the circuit is designed to produce an output signal when frequencies above 15 KHz are detected, and the control computer responds to that signal from the signal generator 30 only when the tool is being lowered to the workpiece. In this way, the distinctive nearly vertical slope that occurs at the instant the tool contacts the workpiece can be automatically detected and communicated to the computer that controls the tool, whereas spikes and other artifacts detected during the drilling, or while the drill is idling, will not be recorded by the computer controlling the drilling.

Values of the components in this circuit diagram are indicated on the drawing and are not repeated here. Other convenient or conventional high-pass filter circuitry may be used, such as a conventional "Butterworth" filter.

Tool Contact Monitoring

FIG. 4 shows the waveform 32, that is output by the detector 28 prior to, during, and following the drilling of a printed circuit board (PCB). At the instant the drill contacts the printed circuit board material there is a sharp drop in voltage. Contact occurs at point A in the waveform. During the drilling of the circuit board material there is then a rise in the voltage, between regions A and B on the waveform shown in FIG. 4. The drill is then retracted from the workpiece, as shown in the waveform between regions B and C. The waveform between 32 and 32' has a characteristic shape after the drill retracts and until the drill again makes contact at 32' with the circuit board material at another location on the workpiece, while the workpiece is moving relative to the drill. This characteristic shape is discussed further, below.

The present invention takes data from the signal of FIG. 4, and identifies the phenomena that are occurring in the drilling process. It should be noted that upon contact of the tool with the printed circuit board material, the voltage shift is dramatic. In a typical embodiment the signal goes from approximately 0.1 volts to 1.0 volts. Thus amplitude criteria may be used in conjunction with slope to detect this point in the waveform. This shift may be negative or also positive depending on the polarity of the detection circuits used. The frequencies above 15 KHz in the signal from the detector 28 is high-pass filtered to provide steep roll-off at 15 KHz to isolate the high-amplitude, nearby the vertical sloe that is the "signature" of the moment of tool contact with the workpiece.

Tool Condition Monitoring

The waveform of FIG. 4, also provides additional information concerning tool condition. Those portions of the signal during the "drilling" time, from A to B, and during the drill retracting time from B to C, provide several types of tool-condition information.

As the tool becomes worn, the signal changes. Furthermore, tool breakage, even a small chip, causes the signal to show a measurable change. These changes can be digitized and fed out through the circuit shown in FIG. 5.

Figure 5:
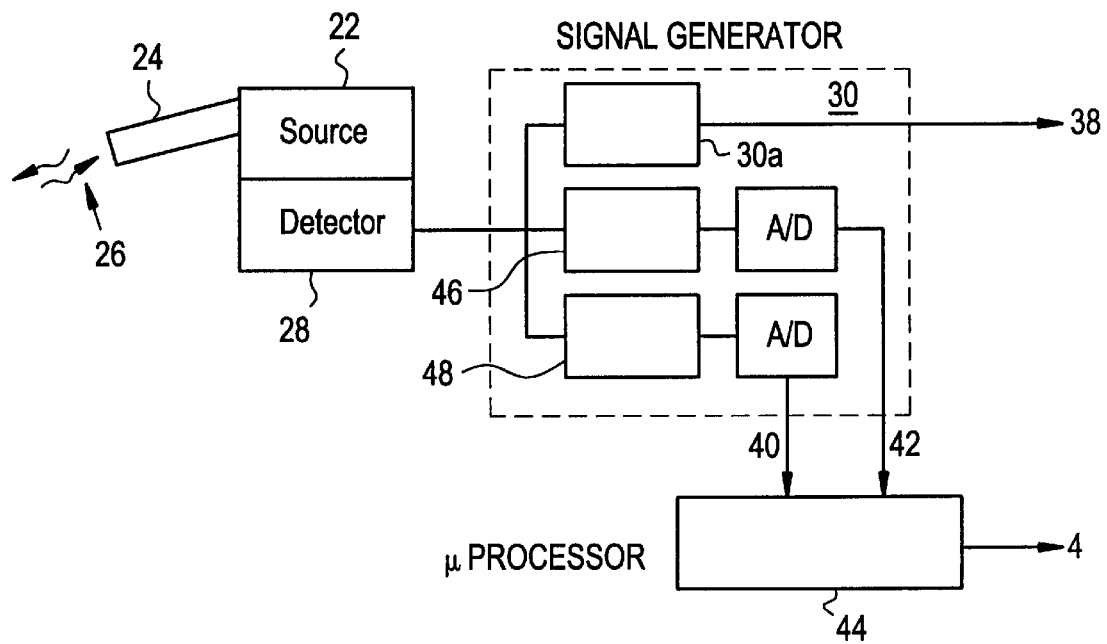
FIG. 5 is a block diagram of a further embodiment of the present invention.

FIG. 5 is a block diagram of a system for implementing this type of tool-condition monitoring. It is generally similar to FIG. 2 but shows a signal generator 30 that has two additional outputs 40, 42, that are supplied to a microprocessor 44 which detects the more complex AC and DC waveform "signatures" that indicate the condition of the tool that is doing the drilling. These outputs 40, 42 are analyzed by the microprocessor 44, using the memory 34, which stores the reference pattern data from the analyzed waveform. The microprocessor 44 outputs a control signal 49 which reports the condition of the tool to the tool-control computer, based on the "signatures" it finds in the AC and DC waveforms supplied by the signal generator 30.

Preferably, output 38 is not digitized since an expensive analog-to-digital (A/D) converter with a response time in the 1–2 microsecond range would be required and the expected output is merely a pulse. However, an A/D converter with a 10–20 microsecond response may be used to digitize the signal 40 provided by the 15 KHz to 20 Hz bandpass filter 46 and any suitable A/D conversion for the DC-coupled baseline shift data 42 provided by he low-pass filter 48. The comparator 36 compares the digital pattern of the analyzed signal coming from the respective signal generator output 40, 42 with the reference patterns stored in memory. The comparator then forwards a respective control signal on lead 38 to the tool's computer control when a given pattern criterion statistically correlated with a given tool condition is satisfied.

It has been discovered that, by observing the waveforms produced by electromagnetic energy reflected from a tool in a particular type of operation on a particular workpiece, statistically significant pattern elements or "signatures" can be identified, and used to monitor conditions such as: (1) the tool is new, (2) the tool is worn and should be replaced, (3) the tool is not clear of debris from the cutting action from the flutes, or the tool is clogged with debris, (4) the tool has changed speed or reversed direction, and (5) the tool is made of the correct material and has the correct shape. For example, after the contact of tool to workpiece at 32, a new, sharp tool will produce a characteristic signature in the part of the waveform after contact, the segment immediately after point A. This signal goes through a progression of changes as the tool wears and is no longer as sharp. The waveform segment between points B and C indicates whether debris is still in the flutes during retraction of the tool from the workpiece. The waveform segment after C and before the next contact point A reflects the shape and material of the tool as it moves in air. This may include reciprocating as well as rotary motion.

The foregoing list of features that can be monitored is not intended to be all-inclusive. Other items such as monitoring tool's actual rotational, linear speed of frequency, and detection of variations in workpiece materials, such as changes in porosity or contact with inclusions of foreign material are other examples of other types of signatures. Simple observation and conventional statistical waveform analysis techniques can be used in accordance with the present invention, as taught in this disclosure, to improve control of drilling and tapping operations in the manufacturing process.

The embodiments discussed above are adapted for circuit board manufacture. However, the invention is also useful for machine tool applications where the drill bits may have 2" diameters. Furthermore, the invention is not limited to drills. Any rotating tool, such as a tap or reamer, and other types of moving tools may be monitored and controlled in accordance with this invention.

Figure 6:
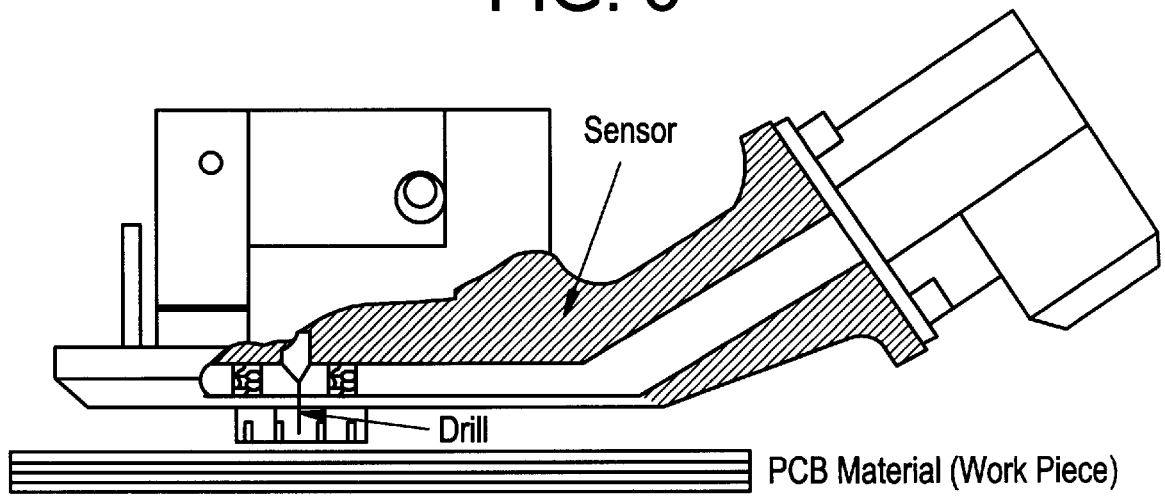
FIG. 6 is a side view, partially in section, showing a sensor head suitable for use in a printed circuit board application.
Figure 7A:
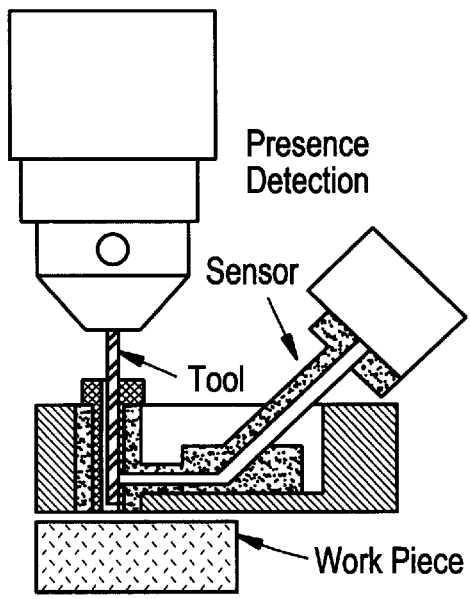
FIGS. 7(a) and 7(b) are side views partially in section, showing a sensor head suitable for use in a machine tool application.
Figure 7B:
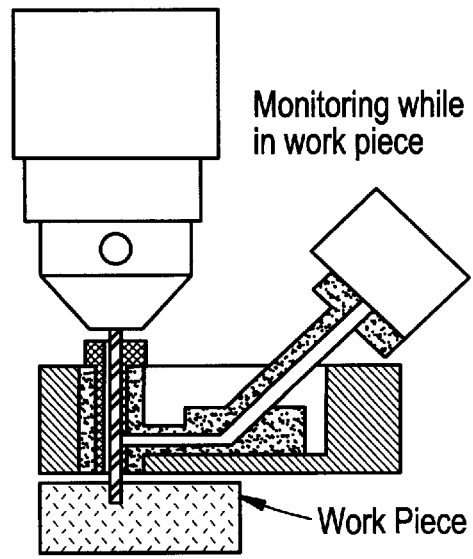

FIG. 6 shows a partially cut away side view of a pressure foot and sensor for use in monitoring printed circuit board applications to provide drilling waveforms such as shown in FIG. 4. FIGS. 7(a) and 7(b) show a sensor head which may be used to provide similar waveforms in monitoring machine tool applications, as described in detail in U.S. Pat. No. 4,613,812.

FIG. 8(a) is the waveform produced by a new sharp tool, similar to the waveform shown. FIG. 8(b) is the signal of the same tool after 1,000 hits, and FIG. 8(c) is after 2,000 hits. In FIGS. 8(a)–8(c) the waveform in the region B shows a substantial change. Reference pattern data from an historical series of different waveforms produced as a tool is repetitively used to the point where the drill breaks or must be discarded, are stored in memory 34. This provides a data base for determining how worn a tool becomes during repetitive operations and predicting when a similar tool drilling similar workpieces will break or have to be discarded. The reference pattern data representing the historical series of waveforms stored as a "signature" reference in memory are compared to the waveform produced by the tool using any customary or convenient curve-fitting method. Preferably, the data would be digitized for use by present conventional microprocessor curve-analysis routines.

Recognizing the waveform signature of a tool that should not be used is particularly important where other factors introduce added variability in tool performance: drilling aggregate materials or using resharpened tools, for example. When waveforms from a "new" tool that is actually a resharpened tool are compared with the respective reference waveform series in memory, as the "new" resharpened tool waveform will begin to match a reference waveform that indicates that the tool is worn out or may break much sooner than would be expected, in terms of the actual number "hits" it has made since it was installed supposedly as a "new" tool. However, regardless of the number of bits the resharpened tool makes, an output signal will be sent to the computer controlling the machine tool to stop drilling and replace the tool when that "worn out" signature is identified by the microprocessor 44.

Figure 9B:
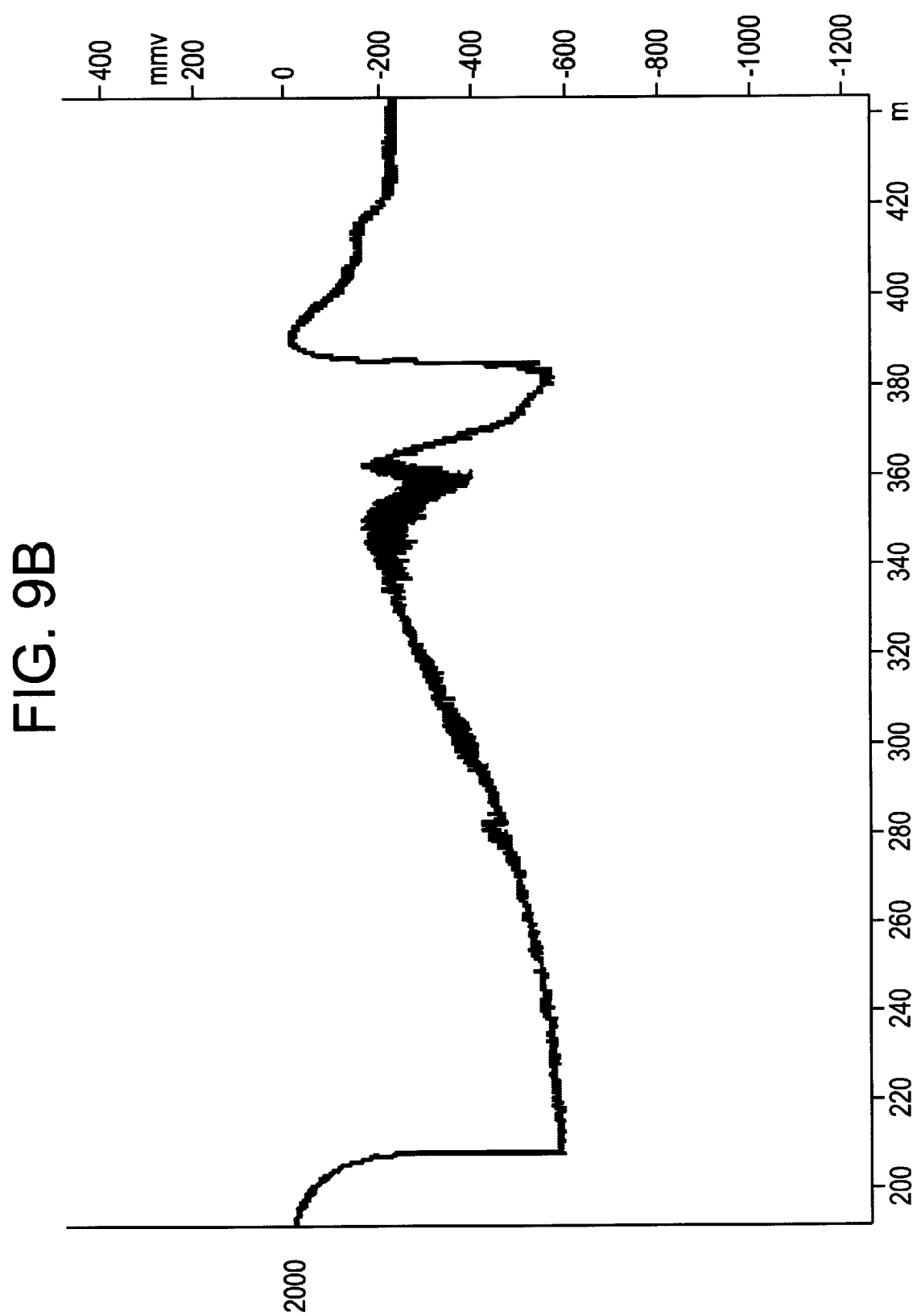
Figure 9C:
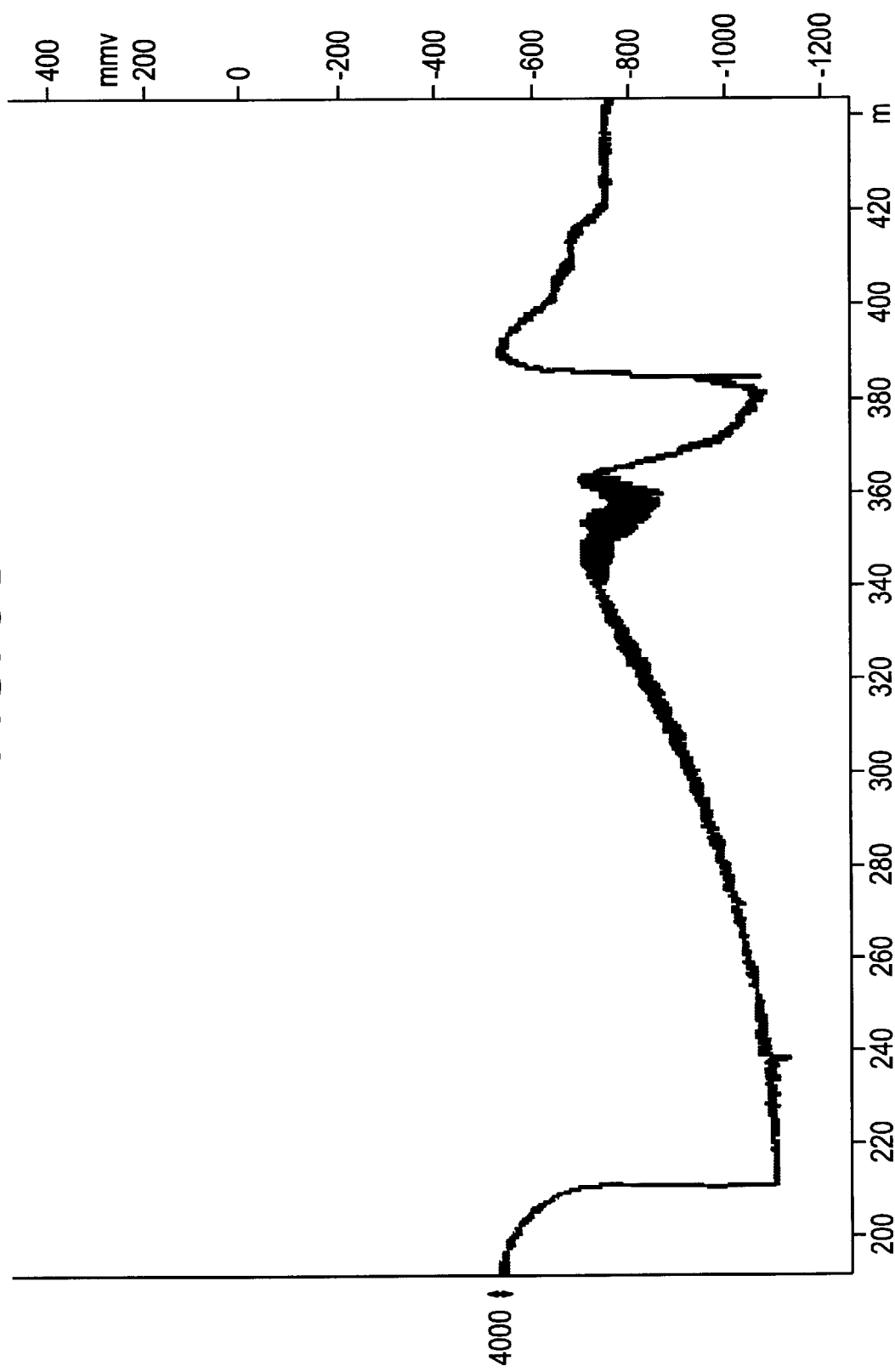

FIGS. 9(a), 9(b), and 9(c) are somewhat larger-scale waveforms, similar to FIG. 4, showing a 0.018" drill in operation. FIG. 9(a) is the waveform produced by the drill when new. FIG. 9(b) is a waveform produced after 2,000 hits, and FIG. 9(c) after 4,000. Particular attention is called to the waveform at the regions D, E and F, which are characteristic of a brand new drill in operation. After approximately 200 hits, the waveforms at D, E and F disappear, as shown in FIG. 9(b), which shows the waveform at 2,000 hits, but the D.E and F portion was gone at 200.

It will be noted that the waveform in region B changes its shape over the operation of 2,000 and 4,000 hits, but still remains in fairly good shape, relative to the tool shown in the next group of Figures.

Figure 10B:
Figure 10C:
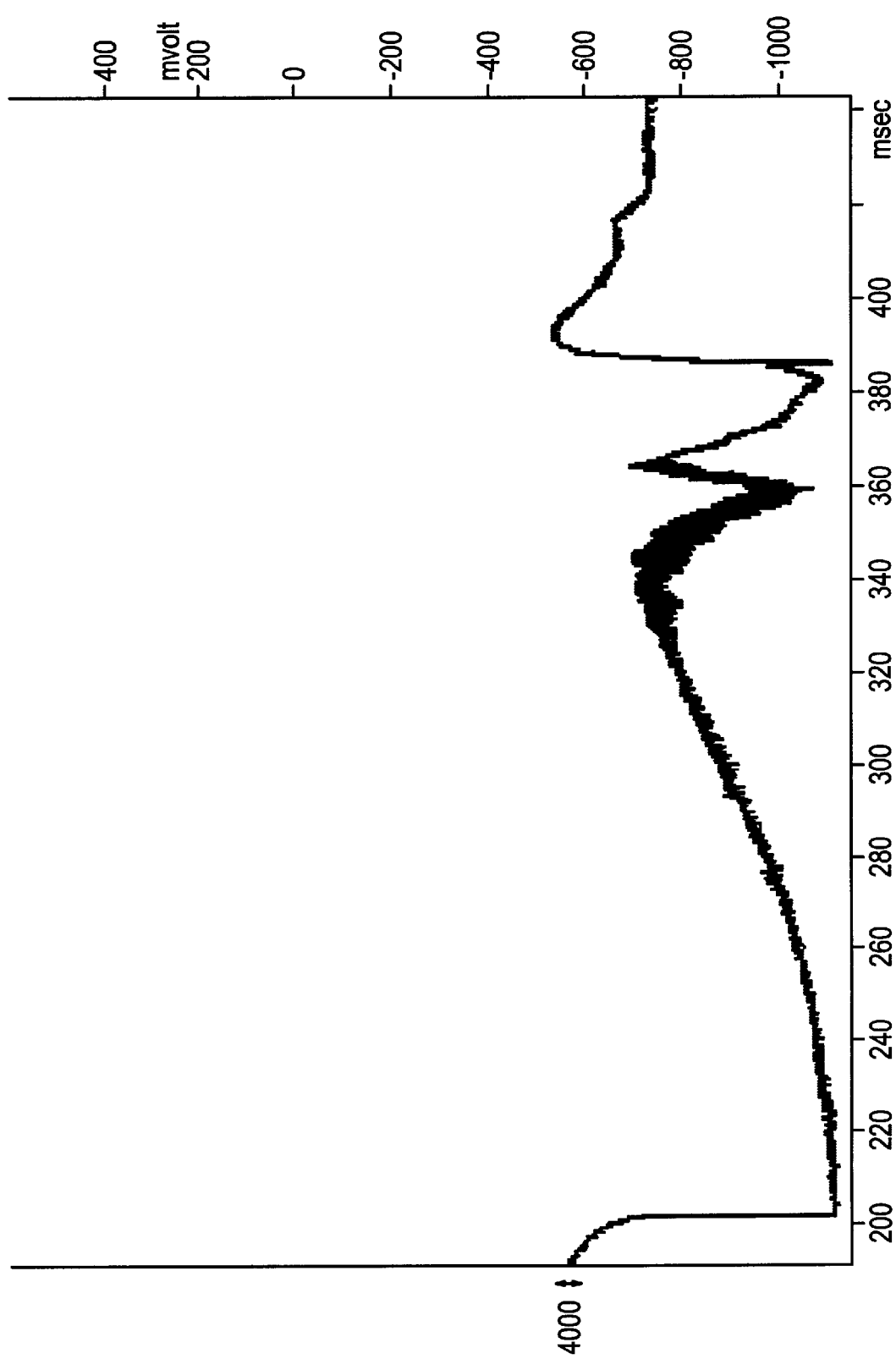
Figure 11:
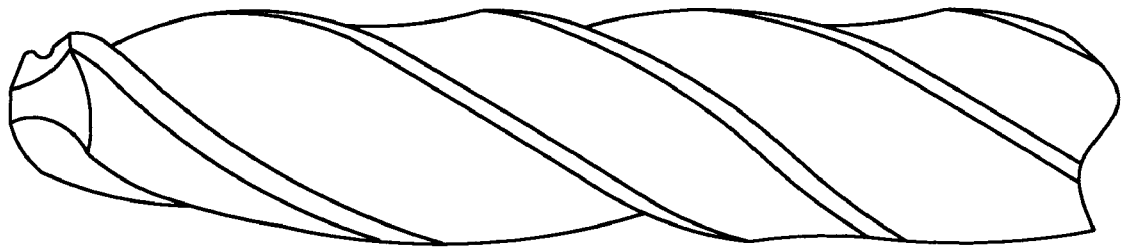
FIG. 11 is a photograph of an 0.018" diameter chipped tool of FIG. 10.

FIGS. 10(a), 10(b) and 10(c) are waveforms of an identical-size drill, but one of which experienced a chip at about 1,200 hits. In FIG. 10(a), shows the waveform characteristic of a brand new drill similar to FIG. 9(a) and bearing the legends D, E and F. It will be noted that the distinctive peaks D, E and F are somewhat differently shaped, but still pronounced and quite distinctive when compared with the waveform of FIG. 10(b) which is the waveform produced after 2,000 hits. The drilling waveforms shown in FIG. 10(a), FIG. 10(b) and FIG. 10(c) can be observed on a computer terminal's display screen. At approximately 1,200 hits there was a marked pulse or irregularity in the waveform in the region between A and B, closer to A. Comparison of FIG. 10(b) with FIG. 9(b) shows that the "worn tool" signature is much more pronounced in the region of the waveform at B, there is different and much steeper drop in FIG. 10(c) than in FIG. 10(b). This difference is shown to be even more pronounced when comparing FIG. 10(c) and FIG. 9(c). This difference in the waveforms pattern is due to significantly greater, faster wear occurring in the operation of chipped drill in FIG. 10(c), than in FIG. 9(c). In particular, the waveform of FIG. 9(c) is closer to the waveform of FIG. 10(b), which is an indication of a degree of wear acceleration resulting in the FIG. 10 series. FIG. 11 is a photograph of the chipped drill of FIG. 10(c), after the 4,000 hits.

FIG. 12, in contrast to the curve shown in FIG. 4, shows a waveform produced by a high-cobalt steel drill, rather than the drill used in FIG. 4. The signature of these high-cobalt steel drills is a distinctively rapid and persistent base-line shift as the high-cobalt drill is separated from the workpiece between drilling operations. This probably reflects a difference in microwave impedance between the drills in FIGS. 4 and 12. The frequency of radiation used to make the measurements in FIG. 9 and FIG. 10 is 10.525 GHz, which is a typical frequency used in circuit board applications. For machine tool applications, that frequency or 24.125 GHz is used. These two frequencies have been assigned by the Federal Communications Commission for industrial sensing purposes. It should be understood, however, that applicant expects that other frequencies will provide similar measurements, and that certain frequencies will be particularly good for use in applications monitoring particular types of tools, and particular workpieces. The advantage of using higher frequencies is that the waveguides needed are slightly smaller.

Figure 13A:
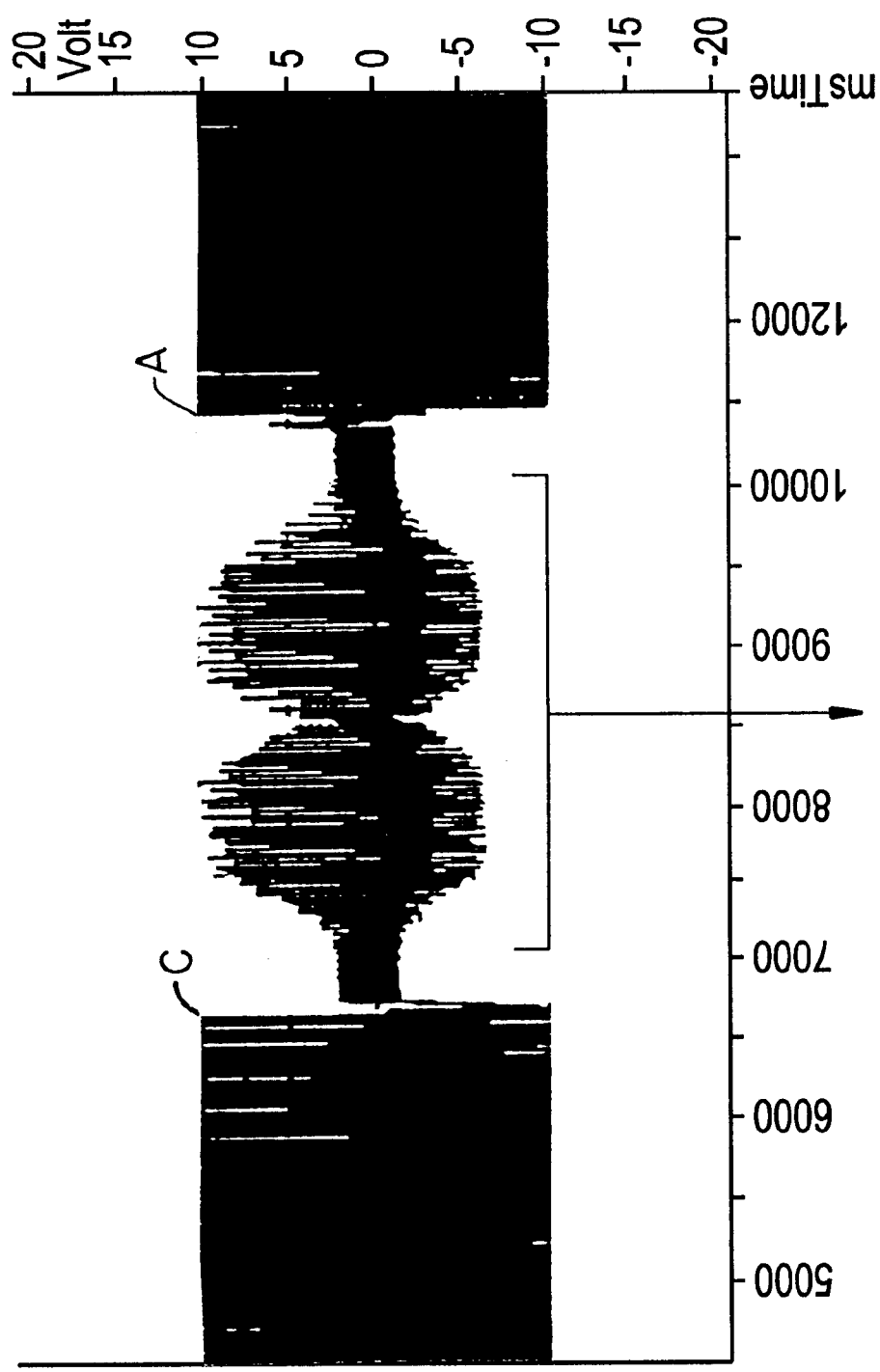
FIGS. 13(a), 13(b) and 13(c) are waveform outputs from a detector during a tapping operation.
Figure 13B:
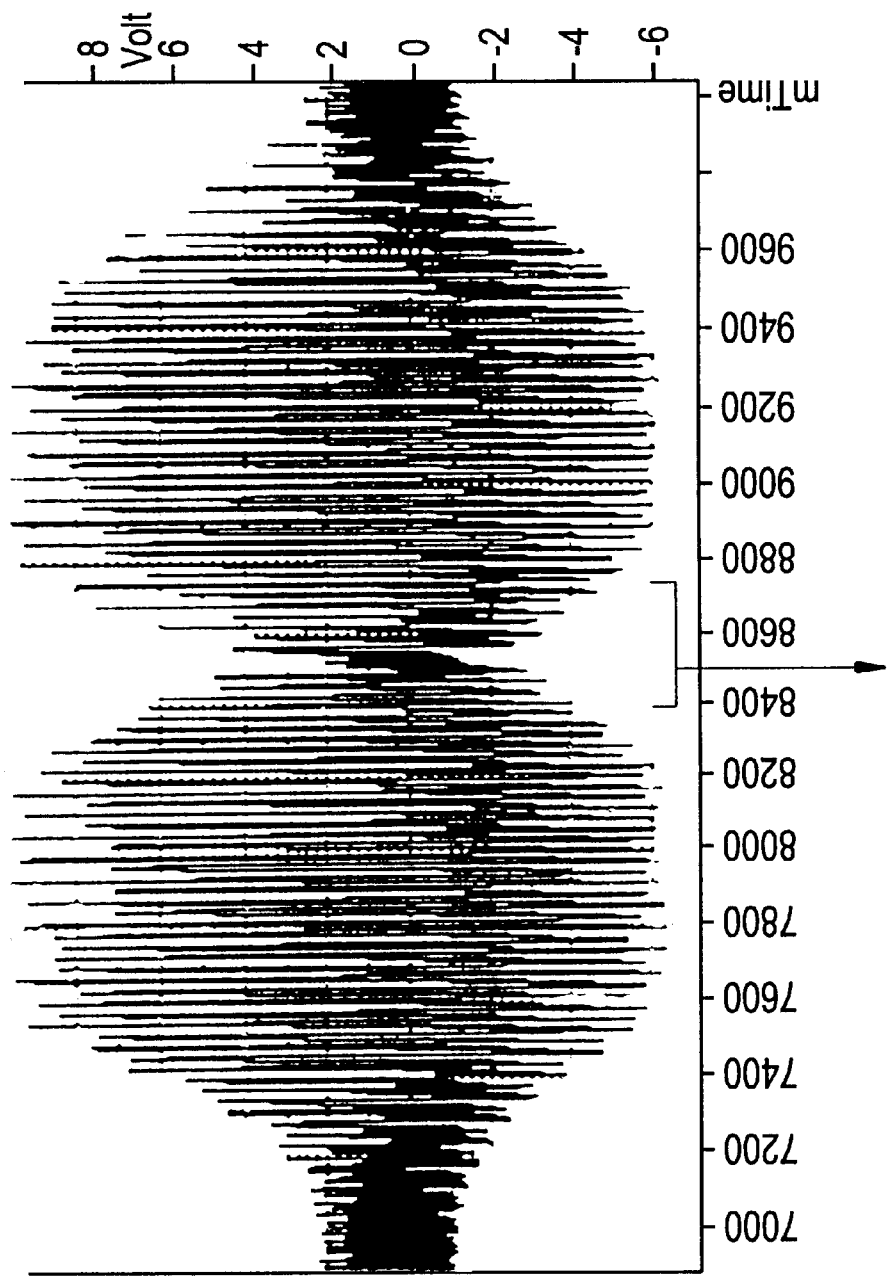
Figure 13C:
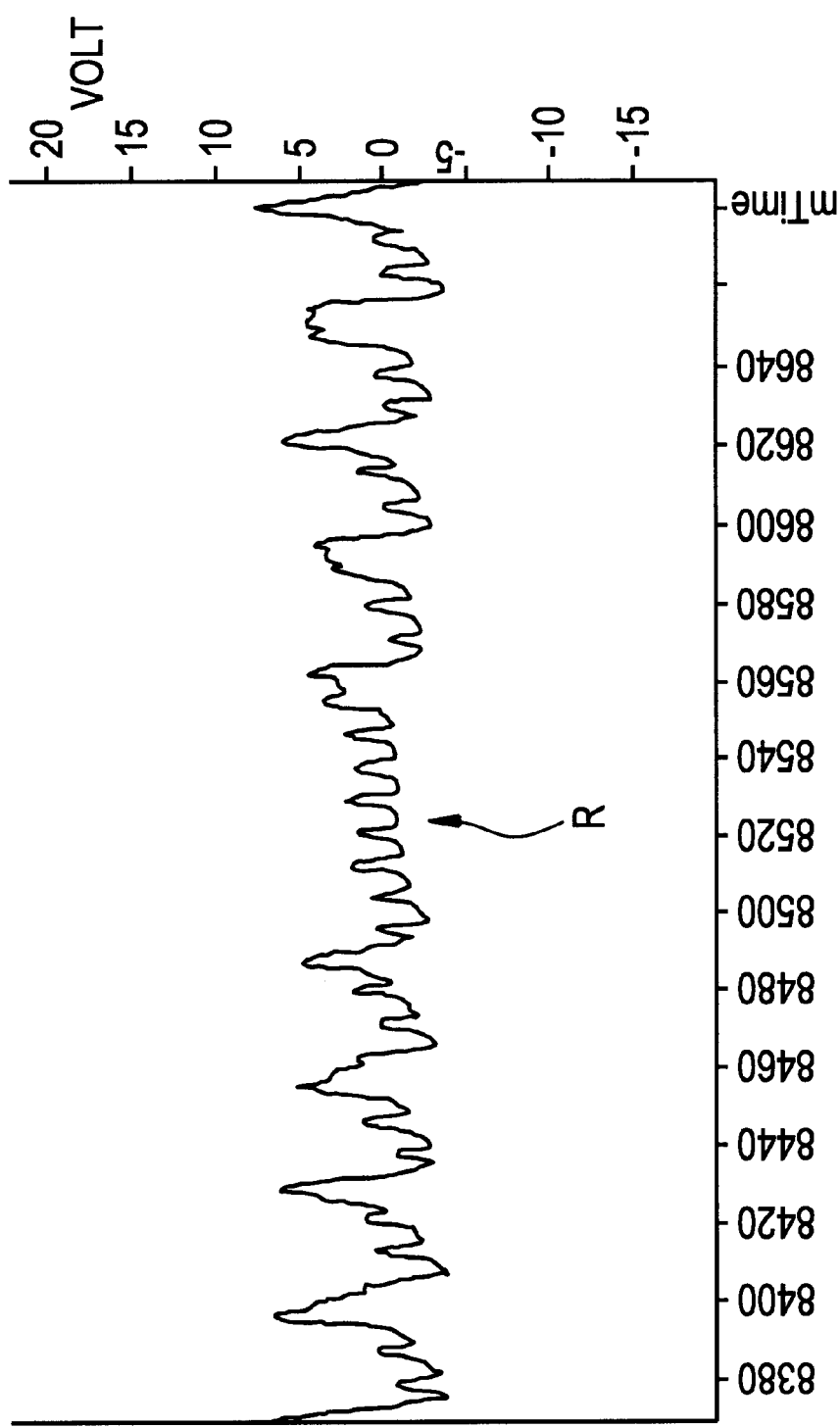

The particular curves shown in FIGS. 4, 8, 9, 10 and 12 generated by a 10.525 Ghz signal source were produced from the analog waveform at a sampling interval of 69.44 microseconds. For machine tool applications the waveguide and sensor structure described in U.S. Pat. No. 4,613,812 "Microwave Detection Systems" is preferred. In machine tool applications the preferred microwave frequency is 24.125 Ghz. For example FIG. 13(a) shows the waveform produced by the directional reversal of a rotating half-round tap between separation of the tap from the workpiece at point C and the next contact between the tap and the workpiece at A. The bracketed segment of the waveform is shown enlarged at FIG. 13(b) and segment of that segment is shown in FIG. 13(c) which shows the absence of the tap's rotational signature at the moment when the rotation of the tap is reversed.

Figure 14:
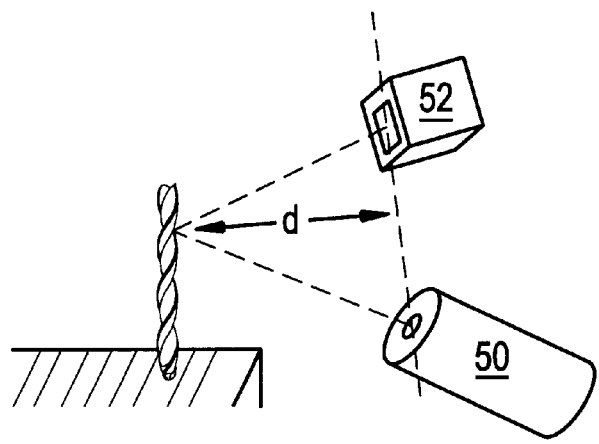
FIG. 14 is a schematic diagram, partially in section, of a laser device according to the present invention.
Figure 15A:
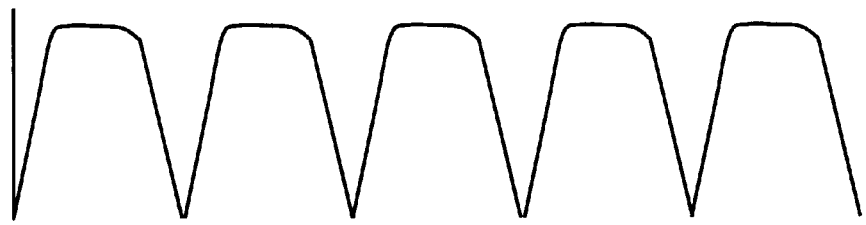
FIGS. 15(a) and (b) are waveforms produced by the device in FIG. 14.
Figure 15B:

FIG. 14 shows an embodiment of a laser tool sensor in accordance with the present invention. The laser 50 is a 5–10 milliwatt 980 nm neon laser focussed onto the fluted surface of the drill to provide direct reflections to a photodetector 52. FIG. 15(a) is the waveform produced by repeated drilling operations, using the laser tool condition sensor. FIG. 15(b) is the waveform produced by the tool shown in FIG. 15(a) after considerable wear has occurred, similar to the curves in FIGS. 9(b) and 9(c).

One disadvantage of the laser system is that debris adds to the amplitude of the signal that is reflected in this part of the spectrum. The waveform produced by the reflected laser beam can be filtered to remove the transients produced by this optical "noise", but such filtering slows the response of the system. This is not acceptable, because such filtering would also eliminate the transients produced when the tool makes contact with the stack. A microwave sensor determines this contact within 10 microseconds of the event. However, laser monitoring is possible as much as 4 inches (approx. 10.2 cm.) from the tool, while the microwave sensor head must be within 1 inch (2.5 cm.) of the tool.

The laser tool monitoring devices for machine tool operations where coolant is not used, because the laser can detect changes in the tool at a greater distance and in some machine tool applications it is very difficult to get close to the tool while it is in use. In these special applications the laser-based systems would be superior to microwave-based systems. Also, laser devices can be used in applications where biological or other types of materials intolerant of microwave radiation are involved.

It will be apparent to one skilled-in-the-art, that variations and modifications are possible within the spirit and scope of the invention.

What is claimed is:
1. An apparatus for monitoring the condition of a tool or a workpiece, an operation of the tool being controlled by a tool controlling device, the apparatus comprising:
   (a) an electromagnetic energy source for generating and directing electromagnetic energy toward the tool and receiving electromagnetic energy reflected off the tool:
   (b) a detector arranged to receive the reflected electromagnetic energy from the electromagnetic energy source and for converting the reflected energy into electronic signals comprising AC and DC waveform signatures;
   (c) a control signal generator operatively connected to the detector for receiving the electronic signals from the detector and outputting a control signal indicative of a condition of the tool to the tool controlling device which control signal is based on the electronic signals received from the detector; and
   (d) a signal analyzing device operatively connected to the control signal generator for analyzing and comparing the AC and DC waveform signatures of the electronic signals received from the control signal generator to reference waveform signatures to determine the condition of the tool or workpiece and to differentiate at least one of: a chipped tool from an unchipped tool, a less sharp tool from a sharp tool, a debris-laden tool from a debris-free tool, and a desired diameter from a diameter of the tool being monitored, wherein the control signal generator generates the control signal based on comparison performed by the signal analyzing device.
2. An apparatus according to claim 1, wherein the electromagnetic energy source includes a wave guide for directing electromagnetic microwave energy toward the tool.
3. An apparatus according to claim 1, wherein the signal analyzing device includes a comparator adapted to differentiate chipped tools from unchipped tools.
4. An apparatus according to claim 1, wherein the signal analyzing device includes a comparator adapted to differentiate less sharp tools from sharp tools.
5. An apparatus according to claim 1, wherein the signal analyzing device includes a comparator adapted to differentiate debris-laden tools from debris-free tools.
6. An apparatus according to claim 1, wherein the signal analyzing device includes a comparator adapted to differentiate a desired diameter from the diameter of the monitored tool.
7. An apparatus according to claim 1, further comprising a microprocessor containing the signal analyzing device and a memory for storing the reference signals.
8. A method of monitoring the condition of a tool that operates on a workpiece, an operation of the tool being controlled by a tool controlling device, the method comprising the steps of:
   (a) applying electromagnetic energy against the tool and receiving electromagnetic energy reflected off the tool;
   (b) converting the reflected energy into electronic signals comprising AC and DC waveform signatures;
   (c) analyzing and comparing the AC and DC waveform signatures of the electronic signals to reference AC and DC waveform signatures to determine the condition of the tool or the workpiece and to differentiate at least one of: a chipped tool from an unchipped tool, a less sharp tool from a sharp tool, a debris-laden tool from a debris-free tool, and a desired diameter from a diameter of the tool being monitored;
   (d) generating a control signal based on a result of the step of comparing the AC and DC waveform signatures of the electronic signals to the AC and DC waveform signatures of the reference signals; and (e) transmitting the control signal to the tool controlling device.

9. A method according the claim 8 wherein the electromagnetic energy is microwave energy.

10. A method according to claim 8, wherein the step of comparing the electronic signals to reference signals differentiates chipped tools from unchipped tools.

11. A method according to claim 8, wherein the step of comparing the electronic signals to reference signals differentiates less sharp tools from sharp tools.

12. A method according to claim 8, wherein the step of comparing the electronic signals to reference signals differentiates debris-laden tools from debris-free tools.

13. A method according to claim 8, wherein the step of comparing the electronic signals to reference signals differentiates a desired diameter from the diameter of the monitored tool.

14. A method according to claim 8 wherein the electromagnetic energy is laser energy.

15. A method of monitoring the condition of a workpiece during contact of a tool with the workpiece, the tool being controlled by a tool controlling device, the method comprising the steps of:

(a) applying electromagnetic energy against the tool and receiving electromagnetic energy reflected off the tool;

(b) converting the reflected energy into electronic signals including AC and DC waveform signatures;

(c) analyzing and comparing the AC and DC waveform signatures of the electronic signals to reference AC and DC waveform signatures to determine the condition of the tool or the workpiece and to differentiate at least one of: a chipped tool from an unchipped tool, a less sharp tool from a sharp tool, a debris-laden tool from a debris-free tool, and a desired diameter from a diameter of the tool being monitored; and (d) evaluating a result of the step of comparing to determine the presence or absence of discontinuities in the workpiece.

16. A method according the claim 15 wherein the electromagnetic energy is microwave energy.

17. A method according to claim 15, wherein the step of comparing the electronic signals to reference signals differentiates a desired diameter from the diameter of a hole in the workpiece.

18. A method according to claim 15 wherein the electromagnetic energy is laser energy.

19. A method according to claim 15 wherein the workpiece is homogeneous.

20. A method according to claim 15 wherein the workpiece is non-homogeneous.

21. An apparatus for monitoring a condition of a tool or a workpiece to identify at least one phenomenon that is occurring in an operation of the tool, the operation of the tool being controlled by a tool controlling device, the apparatus comprising:

(a) an electromagnetic energy source for generating and directing electromagnetic energy toward the tool and receiving electromagnetic energy reflected off the tool;

(b) a detector arranged to receive the reflected electromagnetic energy from the electromagnetic energy source and for converting the reflected energy into electronic signals comprising AC and DC waveform signatures;

(c) a control signal generator operatively connected to the detector for receiving the electronic signals from the detector and outputting a control signal indicative of the at least one phenomenon to the tool controlling device which control signal is based on the electronic signals received from the detector; and (d) a signal analyzing device operatively connected to the control signal generator for analyzing and comparing the AC and DC waveform signatures of the electronic signals received from the control signal generator to reference waveform signatures to determine the at least one phenomenon, the control signal generator generating the control signal based on comparison performed by the signal analyzing device.

22. A method of monitoring a condition of a tool that operates on a workpiece to identify at least one phenomenon that is occurring in an operation of the tool, the operation of the tool being controlled by a tool controlling device, the method comprising the steps of:

(a) applying electromagnetic energy against the tool and receiving electromagnetic energy reflected off the tool;

(b) converting the reflected energy into electronic signals comprising AC and DC waveform signatures;

(c) analyzing and comparing the AC and DC waveform signatures of the electronic signals to reference AC and DC waveform signatures to determine the at least one phenomenon;

(d) generating a control signal based on a result of the step of comparing the AC and DC waveform signatures of the electronic signals to the AC and DC waveform signatures of the reference AC and DC signatures; and (e) transmitting the control signal to the tool controlling device.

23. A method of monitoring a condition of a workpiece during contact of a tool with the workpiece, to identify at least one phenomenon that is occurring in an operation of the tool, the tool being controlled by a tool controlling device, the method comprising the steps of:

(a) applying electromagnetic energy against the tool and receiving electromagnetic energy reflected off the tool;

(b) converting the reflected energy into electronic signals including AC and DC waveform signatures;

(c) analyzing and comparing the AC and DC waveform signatures of the electronic signals to reference AC and DC waveform signatures to determine the at least one phenomenon; and (d) evaluating a result of the step of comparing to determine whether discontinuities are present in the workpiece.

* * * * *